United States Patent [19]

Falanga

[11] Patent Number: 4,750,665
[45] Date of Patent: Jun. 14, 1988

[54] METHOD OF PRODUCING A COMBINATION COVER

[75] Inventor: Richard J. Falanga, Utica, N.Y.

[73] Assignee: Indium Corporation of America, New Hartford, N.Y.

[21] Appl. No.: 933,567

[22] Filed: Nov. 21, 1986

[51] Int. Cl.[4] ............................................. B23K 31/02
[52] U.S. Cl. .................................... 228/123; 228/124; 228/248; 228/263.12; 29/841
[58] Field of Search ............... 228/123, 124, 208, 226, 228/248, 263.12; 220/200, 359; 29/588, 841, 855; 427/125, 404; 361/421

[56] References Cited

U.S. PATENT DOCUMENTS

| | | | |
|---|---|---|---|
| 3,340,602 | 2/1965 | Hontz | 29/588 |
| 4,291,815 | 9/1981 | Gordon et al. | 220/200 |
| 4,331,253 | 5/1982 | Gordon et al. | 220/200 |
| 4,331,258 | 5/1982 | Geschwind | 220/359 |
| 4,356,047 | 10/1982 | Gordon et al. | 156/89 |

OTHER PUBLICATIONS

Zirmex, div. Demetron, Inc.-Zirmex Ceramic Lids to Hermetically Seal Chip Carriers and Side Braze Packages, Passes Mil Std 883B, 750 & 202 Test Levels.

Primary Examiner—Nicholas P. Godici
Assistant Examiner—Samuel M. Heinrich
Attorney, Agent, or Firm—Wall and Roehrig

[57] ABSTRACT

A process for manufacturing combination covers for closing and sealing an electronic package that includes a ceramic lid having a noble metal base frame thick-filmed onto the lid and fired therewith to fuse the base metal to the lid. A gold-tin solder frame is placed over the base frame and bonded thereto to complete the cover.

5 Claims, 2 Drawing Sheets

METHOD OF PRODUCING A COMBINATION COVER

BACKGROUND OF THE INVENTION

This invention relates to a method for manufacturing a combination cover for closing the chip cavity of a semiconductor package and, in particular, to manufacturing a corrosion proof combination cover for closing and sealing a high reliability micro electronic package.

In the packaging of high reliability micro-circuits, a semiconductor chip is typically housed with a cavity formed in a ceramic housing and a lid is sealed to the housing to close the package. The lid is generally formed of an iron based metal called Kovar and the seal is formed by a pre-formed solder frame that is placed between the lid and package housing. In U.S. Pat. No. 3,946,190 there is described what is generally referred to as a combination cover wherein the solder frame is tack welded to the Kovar lid. The combination cover is capable of being hermetically sealed to the package to protect the enclosed chip.

The Kovar lid of a high reliability package is typically electroplated with a base coating of nickel and a final coating of pure gold. The nickel layer is usually about 100 micro inches thick while the gold outer layer is about 50 micro inches thick. The gold overlayer provides an oxide free surface for the solder which insures that the solder will uniformly wet the lid and thus produce the desired hermetic seal. It should be noted, however, that both coating layers are crystalline in form and thus contain cracks at the grain boundaries along which corrosive atmospheres can attack the iron base Kovar substrate. When this occurs the lid will rust and the protective coating will spald or flake away further promoting and accelerating the rusting process. This leads to premature failure of the package and degradation of the housed device.

Many high reliability packages are now expected to meet the requirements set out in the military specifications Mil-Std-883 C, Method 1009, Test Condition A, which is a salt atmosphere test. Under this test, the closure lids are exposed to a salt spray atmosphere under closely controlled climatic conditions. After twenty four hours of exposure to the corrosive atmosphere, the lids are washed and rinsed thoroughly and then inspected under a microscope to determine if the part has been adversely affected. A nickel-gold plated Kovar lid will invariably fail test test.

In an effort to adapt the Kovar lid to meet military specifications, a multi-coated structure has been devised wherein four coating layers rather than two are electroplated over the Kovar substrate. As described in U.S. Pat. No. 4,601,958, the multi-layers comprise a base layer of nickel followed by successive layers of gold, nickel and gold. To comply with the military specifications, the final layer of gold must be at least 50 micro inches thick. The four layers, when plated to the suggested thicknesses, function to block or dead end the grain boundaries and thus effectively shield the Kovar substrate sufficiently so that it will not be adversely affected by the salt spray test.

Although the multi-layered lid described above has to some extent solved a problem in the art, the lid has certain disadvantages that the present invention overcomes. A relatively large amount of gold must be used in the coating process which is objectionable from a cost standpoint. Furthermore, the first or underlayer of gold cannot be economically recovered in the event a part has to be scrapped and, as a consequence, scrap losses are high. The multiple coatings are subjected to unwanted stressing as the lid progresses through the various plating baths and stress failures can occur if the bath conditions are not closely controlled. Each of the plating steps needed to produce a coating layer is also time consuming and thus relatively expensive. Finally, even with the use of multiple coating layers, there always exists the possibility that the coating shield can be penetrated and the lid attacked by a corrosive atmosphere.

SUMMARY OF THE INVENTION

It is therefore an object of the present invention to improve closure covers used in the packaging of semiconductive devices.

A further object of the present invention is to provide a corrosion proof resistant combination cover for use in high reliability electronic packages.

A still further object of the present invention is to reduce the amount of gold needed in the fabrication of corrosion proof covers used in the packaging of semiconductor devices.

Another object of the present invention is to reduce the amount of time required to produce a corrosion proof combination cover for closing and sealing a semiconductor package.

Yet another object of the present invention is to eliminate the use of Kovar or other corrosive metal lids in the manufacture of closure covers used to seal electronic packages.

Another object of the present invention is to reduce the cost of high reliability packaging of semiconductive devices.

A further object of the present invention is to provide a method for economically producing a corrosion proof combination cover for closing a micro-electronic package.

These and other objects of the present invention are attained by a method for manufacturing corrosion proof covers for use in the closing and sealing of an electronic package. In one form of the invention, a sheet of fired ceramic material is scored by scribed lines to divide the surface area of the sheet into a number of smaller sections each of which defines a combination cover lid. A gold or other precious metal thick-film base metallization is applied to the seal ring portion of each lid section using a screening template or other suitable method of application. The sheet is fired in an air furnace to fuse the metallization base to the ceramic substrate. After firing, a gold-tin solder layer is bonded to the top surface of the base metallization. In one embodiment of the invention, the solder is applied in the form of a paste against using the noted screening or other suitable methods of application. The sheet is heated in a non-oxidizing atmosphere to bond the paste to the base metallization. In a second form of the invention, the solder is preformed to a desired frame configuration and the preform is tack welded to the base metallization. The individual metallized lid sections are then separated from the sheet so they can be used as combination covers for closing electronic packages.

BRIEF DESCRIPTION OF THE DRAWINGS

For a better understanding of these and other objects of the invention, reference is had to the following detailed description of the invention which is to be read in association with the accompanying drawings, wherein:

FIG. 2 is a flow diagram outlining the steps of the present invention;

DESCRIPTION OF THE INVENTION

Figure 1:
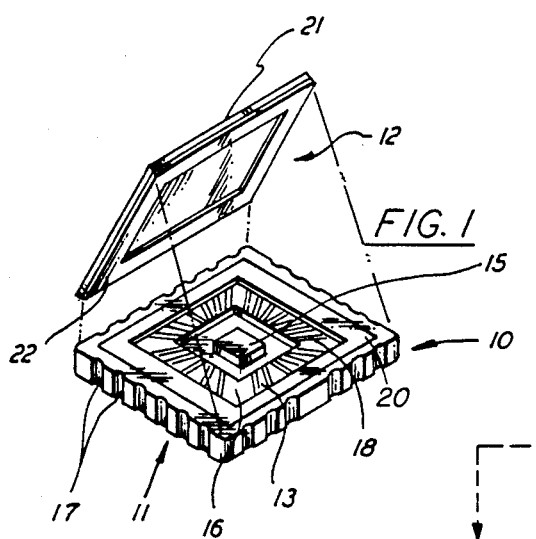
FIG. 1 is a perspective view of an electronic package employing the combination cover of the present invention.

Turning now to the drawings and specifically to FIG. 1 there is shown a high reliability electronic package, generally referenced 10 that includes a ceramic housing 11 and a combination cover 12. The term "combination cover" as herein used shall mean a device for closing the chip cavity 13 in the housing and includes a flat lid 21 having a solder frame 22 attached thereto. The package contains a semiconductor chip 15 that is attached to the floor 16 of the chip cavity and which is further connected to a series of exterior terminals 17—17 by means of wire leads 18—18. A metal pad 20 surrounds the chip cavity and is adapted to receive the solder frame of the cover thereon. A gold-tin eutectic solder composition is employed that is capable of being reflowed onto the pad when heated to a predetermined temperature to form a reliable hermetic seal between the cover and the package housing.

Heretofore, it has been the common practice to fabricate cover lids from a cobalt-nickel-iron alloys metal marketed under the trade name Kovar. This particular metal is preferred because it has about the same coefficient of thermal expansion as most ceramic housings and the danger of the package being thermal stressed under adverse operating conditions is thus minimized. The iron based lids, however, are highly susceptible to corrosion failure particularly when exposed to salt air or any other type of corrosive atmosphere. Accordingly, these covers fail when subjected to an industry wide test set out in Mil-Std-883C, Method 1009, Test Condition A, Salt Atmosphere. Failure generally occurs because the iron base Kovar lid used in most conventional covers corrodes causing rust spots to develop and/or the outer coating of the lid to flake or bubble. In an effort to more fully protect the Kovar lid, multiple layered coatings have been devised, however, for the most part these covers are relatively expensive and not totally corrosion resistant.

In the present invention, the lid portion of the combination cover 12 (FIG. 1) is made of a ceramic material and the solder frame is a eutectic alloy containing 80% gold and 20% tin. This solder composition is well known in the art and widely used in high reliability applications because of its ability to form a hermetic seal against gold surfaces without chemical fluxes when the solder is heated to its eutectic reflow temperature. As will be explained in greater detail below, applicant has devised a process by which this type of solder can be bonded to a ceramic lid to produce a combination cover that can be used in association with most ceramic semiconductor packages to provide a high reliability hermetic seal between the package seal ring and the ceramic lid.

Figure 3:
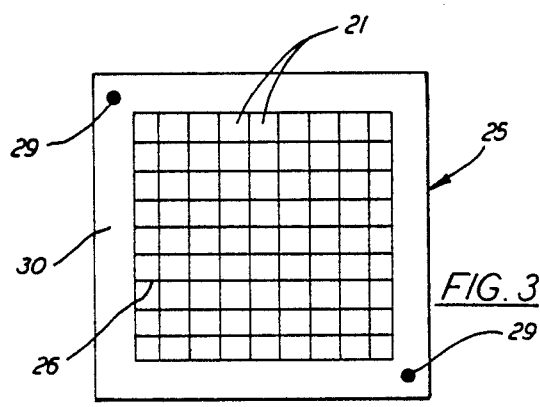
FIG. 3 is a top plan view of a ceramic sheet that has been scribed to outline a plurality of lids.

Turning now to the flow diagram shown in FIG. 2, a flat ceramic sheet 25 (FIG. 3) is initially divided into a plurality of smaller lid sections 21—21. The ceramic sheet is divided as shown by scribing or scoring vertical and horizontal grid lines 26—26 into the top surfaces of the sheet. Although the lid sections are depicted as being square shaped, they may take any suitable form needed to fit. The ceramic sheet is preferably about 0.025 inches thick and is fabricated of a material containing between 92% to 96% alumina and suitable binder and carrier materials. Accordingly, the lid exhibits a higher dielectric strength when compared to a metal based lid, and as a result, it is ideally well suited for use in devices which operates at high frequencies as the potential for metallic interference is decreased.

Figure 4:
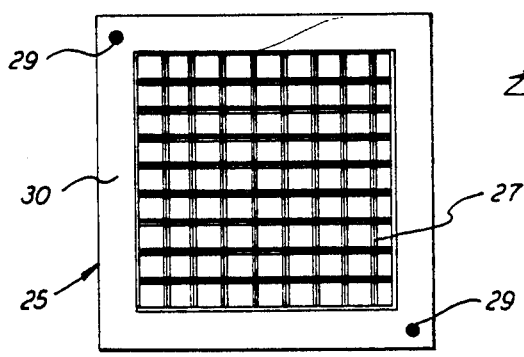
FIG. 4 is a top plane view of the ceramic sheet showing the thick-film precious metallization applied thereto.
Figure 5:
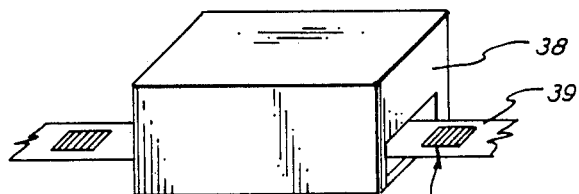
FIG. 5 is a perspective view of a belt furnace for firing the thick-film metallization onto ceramic sheets.

After the surface of the ceramic sheet has been scribed or scored, a frame shaped base metallization material 27 (FIGS. 4 and 9) is applied to the seal ring perimeter of each of the lid sections. A screening template (not shown) is laid over the top surface of the ceramic sheet and is registered with the grid lines using orientation dots 29—29, located in the side margin 30 of the sheet. The template contains a series of frame openings that complement the lid sections when the template is registered with the sheet. Each opening contains a 200-325 mesh screen through which a base metal is applied. The base metal is applied through the screens onto the sheet using squeegee speeds of about 2 to 12 inches per second. Best results are obtained using a sharp edged squeegee and an angle of attack of between 30 degrees and 45 degrees while applying a pressure of about three pounds. Alternately direct writing techniques can be utilized to deposit the thick-film metallization. Preferably, the base metal is a pure gold composition, such as, Dupont composition 9110 manufactured by E. I. Dupont DeNemour's & Co. of Wilmington, Del. Preferably the gold is applied to a fired uniform thickness of about 10 micro inches.

Figure 6:
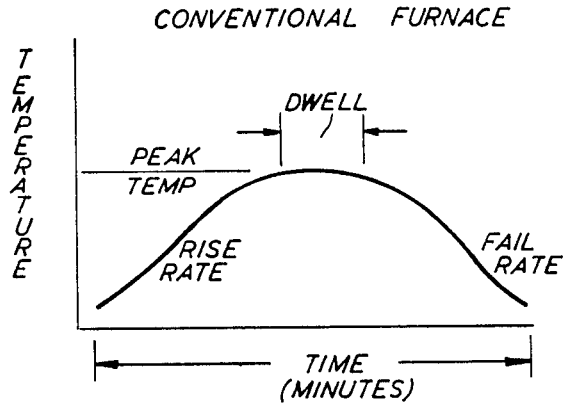
FIG. 6 is a diagram in which time is plotted against temperature showing the heating profile of the in-furnace firing of the thick-film metallization onto the ceramic sheets in FIG. 4.

The thick-film base printed upon the ceramic sheet is heated and allowed to level for 5 or 10 minutes and is then fired in a belt furnace 38 (FIG. 6). The sheets are placed face up on a belt 39 and transported through the furnace at a predetermined speed and temperature profile. The furnace may be either conventional, using conductive and/or convective heating means, or an infra-red device wherein the printed sheets are exposed to suitable radiation to bring the sheets up to a desired fusing temperature. The sheets are held at peak temperatures of about 850 C. for between five and fifteen minutes in an air atmosphere. As the thick film is being fused to the ceramic substrate, the liquid carrier and volatile binder materials contained in the composition are also burned off.

The fired sheet is removed from the furnace, and after cooling, the sheet is again metallized using the technique described above to apply a layer of gold-tin solder directly over the gold base metallization layer. A gold-tin solder paste provided by Indium Corporation of America, Utica, N.Y. is used for this purpose. The solder frame coating 40 is applied to a thickness of about 0.003 inches over the base metal. The paste is again allowed to level and the sheets are heated to a desired temperature in a controlled dry nitrogen atmosphere. The sheets are held at a peak temperature of about 350 degrees for a period of time of about 2 minutes whereupon the solder wets the base metal to form a bond therebetween.

Figure 7:
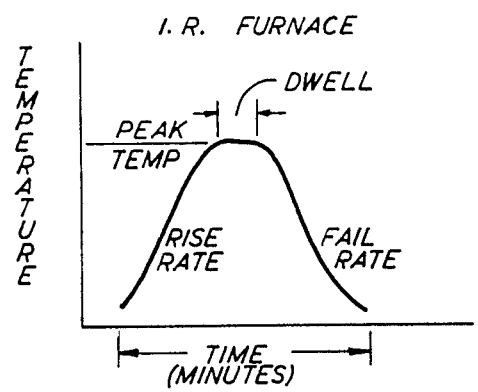
FIG. 7 is a second diagram in which time is again plotted against temperature showing a heating profile for an infra-red furnace.

As noted, either a conventional furnace or an infra-red belt furnace may be used to fire the thick-film base and to flow the solder onto the base. The heating profiles for the furnaces are shown in FIGS. 6 and 7 and the preferred operating parameters are set forth in Table I below.

TABLE I

|  | CONVENTIONAL FURNACE | | INFRA-RED FURNACE | |
| --- | --- | --- | --- | --- |
|  | Thick-Film | Au/Sn Solder | Thick-Film | Au/Sn Solder |
| RISE | 50 ∓ 10°/min | 80 ∓ 20°/min | 85 ∓ 15°/min | 100 ∓ 15°/min |
| PEAK | 850 ∓ 10° C. | 350 ∓ 50° C. | 850 ∓ 10° C. | 350 ∓ 50° C. |
| DWELL | 10 ∓ 2 min | 2 ∓ 1 min | 5 ∓ 3 min | 2 ∓ 1 min |
| FALL | 50 ∓ 10°/min | 30 ∓ 10°/min | 85 ∓ 15°/min | 30 ∓ 10°/min |
| TIME | 60 ∓ 10 min | 10 ∓ 5 min | 35 ∓ 10 min | 8 ∓ 4 min |
| ATMOSPHERE | DRY AIR | DRY $N_2$ | DRY AIR | DRY $N_2$ |

Figure 8:
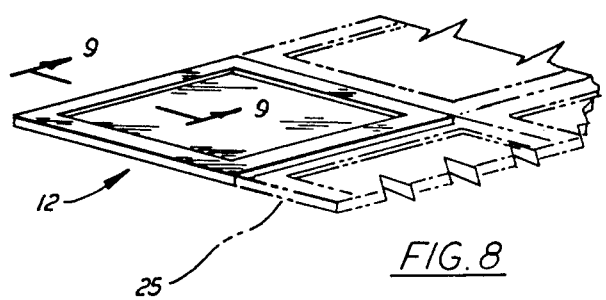
FIG. 8 is an enlarged perspective view showing an individual cover produced on the cover of a ceramic sheet.

The sheet is removed from the furnace and permitted to cool. Once cooled, the sheet is then cleaned in a bath of a suitable solvent, capable of removing solder flux and other contaminants therefrom. The cleaned sheet is now broken along the score lines to separate the individual covers as illustrated in FIG. 8.

Figure 9:
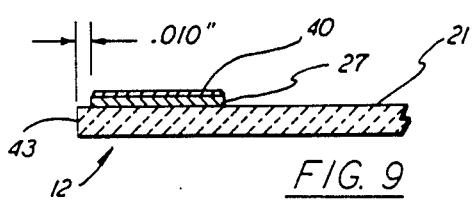
FIG. 9 is an enlarged partial view in section taken along line 9—9 in FIG. 8.

Preferably, each combination cover contains a ceramic lid 21 that is about 0.025 inches thick, a base 27 of precious metallization material that is about 10 micrometers thick, and an overlying gold-tin solder layer 40 that is about 0.003 inches thick. As illustrated in FIG. 9, the superimposed frames 27 and 40 are set back about 0.01 inches from the side edges 43 of the lid so that the individual covers can be separated from the ceramic sheet 25 without disturbing the metallization layers. Beyond being corrosion proof and exhibiting a high dielectric strength, the present lid also has sufficient mechanical beam strength to resist bending under load. This, in turn, protects the integrity of the seal when the closed package is stressed under relatively high loads. The solder frame is bonded to the lid using a minimum amount of the precious metal, but without sacrificing either the bond strength or the effectiveness of the hermetic seal. The amount of time needed to produce the present cover is also considerably shortened when compared to that required to manufacture a multi-layered cover. Although the use of pure gold is preferred for use as a base metal, a palladium-silver composition may be substituted for the gold. Dupont thick film compositions designated 6120 or 6134 have both been acceptable for metallizing the ceramic lid and accepting a gold-tin solder when using the heating schedules noted in Table I above.

Figure 10:
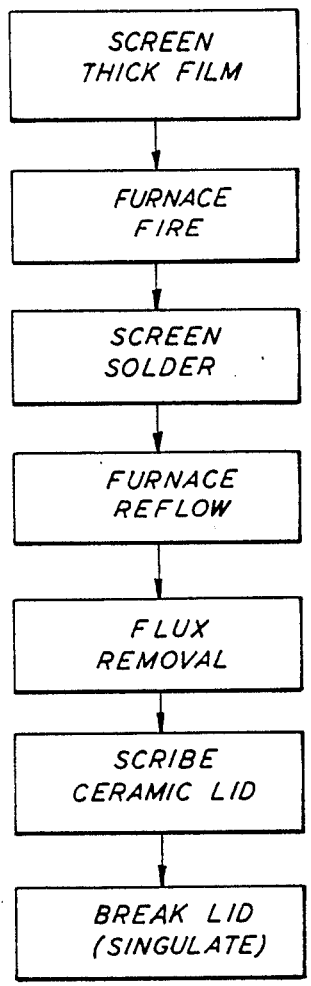
FIG. 10 is also a flow diagram illustrating an alternate method for producing combination covers of the present invention.

Turning now to FIG. 10, there is shown a flow diagram outlining another embodiment of the present invention. Here again a fired ceramic sheet is scored as noted above and a thick-film base metallization is screened onto the sheet inside each lid section. The sheet is fired in air to fuse the base metal to the ceramic substrate.

After being metallized the individual lids are separated from the sheets and a preformed gold-tin solder frame similar to that described in the noted U.S. Pat. No. 3,946,190 is placed in overlying registration over the base frame. The solder frame is bonded to the base frame using the tack welding technique described in the above noted patent.

While this invention has been described in detail with reference to particular embodiments, it should be understood that many modifications and variations would be apparent to those of skill in the art without departure from the scope and spirit of this invention as defined in the appended claims.

What is claimed is:

1. A process for producing a corrosion proof cover for closing and sealing a semi-conductor package that includes the steps of providing a sheet of ceramic material, scoring one surface of said sheet with perpendicular grid lines to divide the sheet into rectangular sections each of which outlines a lid, whereby the lids can be separated individually from the sheet along the scored lines, registering a first template over said one surface to align a frame shaped screening window inside each lid section with the sides of said window being positioned a predetermined distance inside each adjacent grid line, thin filming a metal containing material onto the surface of each lid section through the template window to produce a metal base frame capable of being wetted by a solder to form a bond therebetween, firing the sheet of a desired temperature to fuse each base frame to the underlying ceramic lid section, registering a second template having the same frame shaped window pattern as the first template over said one surface of the ceramic sheet, applying a solder paste to the base frame through said second template to produce a solder frame in registration over each base metal frame, heating the sheet to the reflowed temperature of the solder to join the solder frames to the base metal frames, and separating the individual lids along the scored grid lines.

2. The process of claim 1 wherein the base metal frame of each lid section is formed of pure gold and is screened onto the sheet to a thickness of about ten microns and the solder frame is formed from a material that is 80% gold and 20% tin and which is applied to the base frame to a thickness of about 0.003 inches.

3. The process of claim 1 wherein the base metal frame of each lid section is formed of palladium-silver material and is about ten micrometers thick and said solder frame is formed of 80% gold and 20% tin and is about 0.003 inches thick.

4. A process for producing a corrosion proof cover for closing and sealing a semi-conductor package that includes the steps of providing a sheet of ceramic material, scoring one surface of said sheet with perpendicular grid lines to divide the sheet into rectangular sections each of which outlines a grid, whereby the lids can be separated individually from the sheet along the scored lines, registering a first template over said one surface to align a frame shaped screening window inside each lid section with the sides of said window being positioned a predetermined distance inside each adjacent grid line, thin filming a metal containing material onto the surface of each lid section through the template window to produce a base frame capable of being wetted by a solder to form a bond therebetween, firing the sheet at a desired temperature to fuse each base frame to each underlying ceramic lid section, placing a gold-tin preformed solder frame in registration over the base frame on each lid section, tack welding the solder frame to the base metallization material, and separating the individual lids from the sheet.

5. The process of claim 1 wherein said base frame is formed of a conductive metal and the solder frame is 80% gold and 20% tin.

* * * * *